(12) United States Patent
Nimtz et al.

(10) Patent No.: US 6,356,091 B1
(45) Date of Patent: Mar. 12, 2002

(54) AUTOMATIC WAFER MAPPING IN A WET ENVIRONMENT ON A WAFER CLEANER

(75) Inventors: Jack F. Nimtz, Chandler; Toby Jordan; Robert Allen, both of Gilbert, all of AZ (US)

(73) Assignee: Speedfam-Ipec Corporation, Chandler, AZ (US)

( * ) Notice: Subject to any disclaimer, the term of this patent is extended or adjusted under 35 U.S.C. 154(b) by 0 days.

(21) Appl. No.: 09/196,261

(22) Filed: Nov. 19, 1998

(51) Int. Cl.[7] ............................................... G01R 31/02
(52) U.S. Cl. .......................... 324/755; 324/760; 73/602
(58) Field of Search ........................ 250/559.36, 559.33, 250/559.27, 559.4, 548, 221; 414/937, 939; 365/375; 324/755, 760; 356/614; 702/39; 73/602

(56) References Cited

U.S. PATENT DOCUMENTS

| | | | | |
|---|---|---|---|---|
| 4,947,351 A | * | 8/1990 | Moran | 702/39 |
| 5,206,627 A | | 4/1993 | Kato | |
| 5,239,182 A | * | 8/1993 | Tateyama et al. | |
| 5,418,382 A | | 5/1995 | Blackwood et al. | |
| 5,504,345 A | * | 4/1996 | Bartunek et al. | |
| 5,783,834 A | * | 7/1998 | Shatas | |
| 6,011,627 A | * | 1/2000 | Mulligan | 356/614 |
| 6,013,920 A | * | 1/2000 | Gordon et al. | |
| 6,229,322 B1 | * | 5/2001 | Hembree | 324/755 |

FOREIGN PATENT DOCUMENTS

| | | | | |
|---|---|---|---|---|
| GB | 2 335 979 A | 10/1999 | ........... | H01L/21/00 |
| WO | WO 98/01892 | 1/1998 | ........... | H01L/21/00 |

OTHER PUBLICATIONS

IBM Technical Disclosure Bulletin, vol. 37, No. 04B, Apr. 1994, "Obliquie Water Detect Mechanism".

* cited by examiner

Primary Examiner—John F. Niebling
Assistant Examiner—André Stevenson
(74) Attorney, Agent, or Firm—Snell & Wilmer, LLP

(57) ABSTRACT

A wafer mapping method and apparatus for automatically determining the location and orientation of workpieces within a workpiece processing tool. An illumination device is provided which directs light toward the edges of the workpieces and a vision system is utilized to receive and process the images obtained from the light which is reflected off the edges of the workpieces.

16 Claims, 4 Drawing Sheets

AUTOMATIC WAFER MAPPING IN A WET ENVIRONMENT ON A WAFER CLEANER

TECHNICAL FIELD

The present invention relates to a system for mapping the locations of wafers within a cassette which has been loaded into a wafer processing tool. More particularly, the present invention relates to a vision system utilizing front lighting for mapping the locations of wafers and detecting mispositioned wafers in a wet environment.

BACKGROUND OF THE INVENTION

The manufacture of semiconductor wafers, magnetic disks, and other workpieces typically involves many processing steps. Wafers are sliced from a silicon ingot, polished, and cleaned. Often microelectronic structures are applied to the wafer, followed by application of a layer of dielectric materials. Between processing steps, the wafers are commonly transported between processing stations in cassettes containing a plurality of slots, usually 25, for holding the wafers. Often, the cassettes are carried from a wet output tool, such as a Chemical Mechanical Polishing (CMP) tool, and thus arrive at the next processing station in a wet condition. This is known as a "wet environment", a condition which is exemplified when wafers are transferred between "Auriga" polishers and "Capella" cleaning systems, both of which are manufactured by SpeedFam Corporation of Chandler, Ariz.

As the wafers are loaded into a cassette in the wet output tool, positioning errors may occur. Wafers may end up in a "cross-slotted" position, in which one side of the wafer rests in a first slot and the opposite side rests in a second slot; or they might also assume a "double-slotted" position, in which two wafers occupy one slot within the cassette.

Severe problems can arise if cross-slotted or double-slotted wafers are not detected and corrected before wafer processing commences. Cross-slotted wafers may be difficult or impossible for the transport mechanism to move. With respect to double-slotted wafers, the robot arm may retrieve both wafers and then attempt to simultaneously forward the wafers to the next processing station or step. Simultaneous processing of two wafers may result in the tool becoming jammed or wafers being destroyed. In view of these concerns, systems have been developed for detecting cross-slotted and double-slotted wafers within cassettes.

Numerous approaches have been developed for detecting cross-slotted and double-slotted wafers. In one approach, a laser beam is focused upon each slot in a cassette. If a wafer is present, the beam is ideally reflected off the edge surface of the wafer into the laser's receptacle. To determine whether a wafer is cross-slotted, the laser approach often requires two laser beam scans. The first scan may be focused upon the left edge of the slot while the second scan may be focused upon the right edge, or vice versa. Double scanning may reveal cross-slotted wafers as the reflected laser beam during the first scan will often appear at a different height than the height of the reflected laser beam during the second scan, relative to the plane of the cassette slot being scanned. For a properly slotted wafer, the height of each scan should be approximately the same.

When wafers are double-slotted, however, the laser may not detect the presence of both wafers. Since this approach relies upon the reflection of a laser beam back into the laser, double-slotted wafers may change the incident angle such that the laser beam may shine upon the wafer at an angle other than 90 degrees. As such the laser beam may be reflected away from the laser's receptor, and the presence of double-slotted wafers may not be detected. Complex algorithms are often used to determine the thickness of the object being detected. In a wet environment a water droplet may reflect enough light to cause a false reading.

Use of lasers is also problematic due to the absorption characteristics of the wafers. Upon shining a white light source upon the edge of a silicon wafer, one will commonly observe a rainbow of colors. As the wafer is rotated these colors may change. This phenomena is due to the light absorptive characteristics of materials in general, and silicon wafers in particular. Each color seen on the edge of the wafer indicates that a particular wavelength of the electromagnetic spectrum is being absorbed by the wafer. For white light sources, these absorptions do not usually pose a problem; the entire spectrum is not absorbed, and some of the incident beam is reflected back towards the laser's receptor. For fixed wavelength laser sources, by contrast, absorption can create significant problems. If the absorbed wavelength constitutes a significant portion of the incident beam generated by the laser, the magnitude of the laser beam reflected off the wafer surface may be reduced to such a level that the laser's receptor does not receive enough light to detect the wafer's presence. Lastly, while multi-wavelength lasers are commercially available, their prohibitive costs often make them impractical to utilize for wafer detection.

The laser approach in a wet environment is even more problematic. Due to the refractive nature of wet solutions, the laser beam may be slightly refracted by the solutions. These refractions may prevent the initial laser beam from hitting the wafer at the designated incidence, prevent the reflected laser beams from reaching the laser's receptors, or reflect more light than is normally reflected by a single wafer and thereby appear to the laser receptor as a double slotted wafer. Additionally, wet wafers have a tendency to adhere to the roof of each slot due to surface tension between the wafer and the wet solution. To compensate for this tendency, the entire slot must be scanned by the laser to ensure that adhered wafers are not missed. This drastically increases the amount of time which is spent mapping wafer locations. This time increase is multiplied since each of the 25 slots must be scanned at least once, and often twice, to determine in which slots wafers are located and their orientation. Thus, the laser approach has many disadvantages: it is slow, susceptible to absorption and refraction, and works poorly in wet conditions.

Another approach utilized is an optical vision system utilizing "back lighting", such as the IVS mapping system manufactured by Acuity of Cincinnati, Ohio. In back lighting systems, a light positioned behind the cassette is shined through the cassette to generate a silhouette of each wafer. The silhouettes are captured by a camera, and digitally processed. Silhouettes of cross-slotted wafers typically appear as diagonal lines, while silhouettes of double-slotted wafers are usually thicker than those of single-slotted wafers. Such vision systems typically include processing routines that analyze the silhouettes on a pixel-by-pixel basis and alert the operator when a non-nominal condition is detected. While these systems have generally been reliable fort mapping and tracking wafers in dry environments (that is, processing environments in which the wafers enter the tool from the cassette in a dry state), they have not been reliable in wet environments.

In wet environments, liquid droplets often adhere to the surface of the wafer. When a light is shown through the cassette to create a silhouette of each wafer, the droplets diffract the light and thereby appear to the vision system as a thicker-than-normal silhouette. A false detection of a double-slotted condition may result, requiring the operator to shut processing down, remove and visually inspect the cassette to confirm that each wafer is correctly positioned within the cassette, reload the cassette, and then restart wafer processing. During this operation, the operator must also ensure that no solution is allowed to dry upon the surfaces of any of the wafers, as surface irregularities and contaminations may occur when wet solutions dry upon silicon surfaces and require the wafer to be scrapped.

Another disadvantage attendant to back lit vision systems is the tremendous heat generated by the light source. In order to distinguish between the wafer silhouettes and the illuminated gaps between the wafers, sufficient light must be shown through the cassette to create the distinguishable silhouettes. 150-watt bulbs are commonly utilized. The heat generated from these bulbs increases the likelihood of the solutions drying upon the wafers prior to the wafers' entrance into the cleaning solution. Back lit systems also pose significant electrical insulation obstacles. Due to the wet environment, and the significant voltages required by the vision systems, substantial efforts must be taken to ensure that the system (including the lamps, and cameras) is not electrically shorted.

A wafer mapping system is thus needed that provides for efficient wafer mapping in both wet and dry environments.

SUMMARY OF THE INVENTION

The present invention provides a wafer mapping system which overcomes the noted shortcomings of the prior art and provides a system and a method of automatically determining the location and orientation of workpieces within a workpiece processing tool.

One advantage of the present invention is the provision of a system for accurately mapping wafers in a wet environment. An operator can precisely determine which wafers are cross-slotted or double-slotted in a wet wafer cassette without having to remove the cassette from the tool. A white light is focused on the front edge of the wafers and is reflected off the edges into a vision system positioned to receive the reflected light. Hence, instead of generating shadows for analysis, the system generates light reflections. Moreover, since white light occupies a full spectrum, the impact of absorption of some of the spectrum by the wafer edges is minimized and a sufficient quantity of the incident light is reflected into the vision system. The absorption concerns associated with prior art laser imaging systems are eliminated.

Another advantage of the present invention is that it permits identification of a plurality of wafer positions and orientations simultaneously. Unlike prior art laser scanning systems, an optical vision system can be configured to monitor a prescribed and constant field of view. A white light is shined on the field of view and a "snap shot" of the field of view is captured by the vision system. The snap-shot is digitally processed and analyzed to determine the locations and orientation of each wafer within the field of view. The time-consuming need to scan an entire wafer slot is eliminated as an entire field of cassette slots is captured with one snap-shot. Preferably, the field of view encompasses five cassette slots per snap-shot.

The present invention also eliminates the need for multiple scans per wafer slot required by prior art laser scanning systems. Complete images of multiple wafer positions are captured in one shot instead of the two or more scans per individual wafer position required by laser scanning systems. Consequently, less time is spent mapping and higher rates of wafer throughput are obtained. Decreased mapping time also reduces the likelihood of solutions drying on wet wafer surfaces prior to their insertion into the cleaning solution, thereby reducing the wafer scrapping rate as well.

A further advantage the present invention is removal of the imaging system from the wet environment. Laser systems often must be positioned in close proximity to the wafer cassettes in order to eliminate the distorting effects of the solutions within the wet environment. Similarly, back-lit vision systems often must be positioned relatively close to the cassette to improve detection of silhouettes and to prevent reflections off other surfaces from "filling-in" the silhouettes. The present invention, conversely, relies on reflection of white light, and does not need to be positioned directly in the wet environment in order to obtain accurate measurements. A transparent medium can be used to physically separate the vision system from the wet environment and thereby further reduce the probability of electrical shorts and equipment failure due to the wet environment.

Yet another advantage of the present invention is reduction of the heat generated by the system through utilization of fiber optic light sources to focus the light upon the wafer edges. Fiber optic light sources physically separate the light generating device and hence, the heat generated by the device, from the emission point of the light towards the wafers. The present system also allows a plurality of fiber optic beams to be generated by as few as one source, resulting in savings in equipment costs and eliminating redundancies in lighting systems.

The fiber optic light source may be enhanced or replaced by a strobe light source. Images of wafer locations and orientations are accurately obtained by timing the capture of the image with initiation of the strobe light. Initiation of the strobe light floods the field of view with light, thereby increasing the incident light reflected off the wafer surfaces such that the amount of reflected light is significantly greater than the ambient light entering the lens of the vision system. These and other aspects of the present invention are described in fall detail in the following description, claims and appended drawing figures.

BRIEF DESCRIPTION OF THE DRAWING FIGURES

The present invention will hereinafter be described in conjunction with the appended drawing figures, wherein like numerals generally denote like elements, and:

DETAILED DESCRIPTION OF PREFERRED EXEMPLARY EMBODIMENTS

Figure 1:
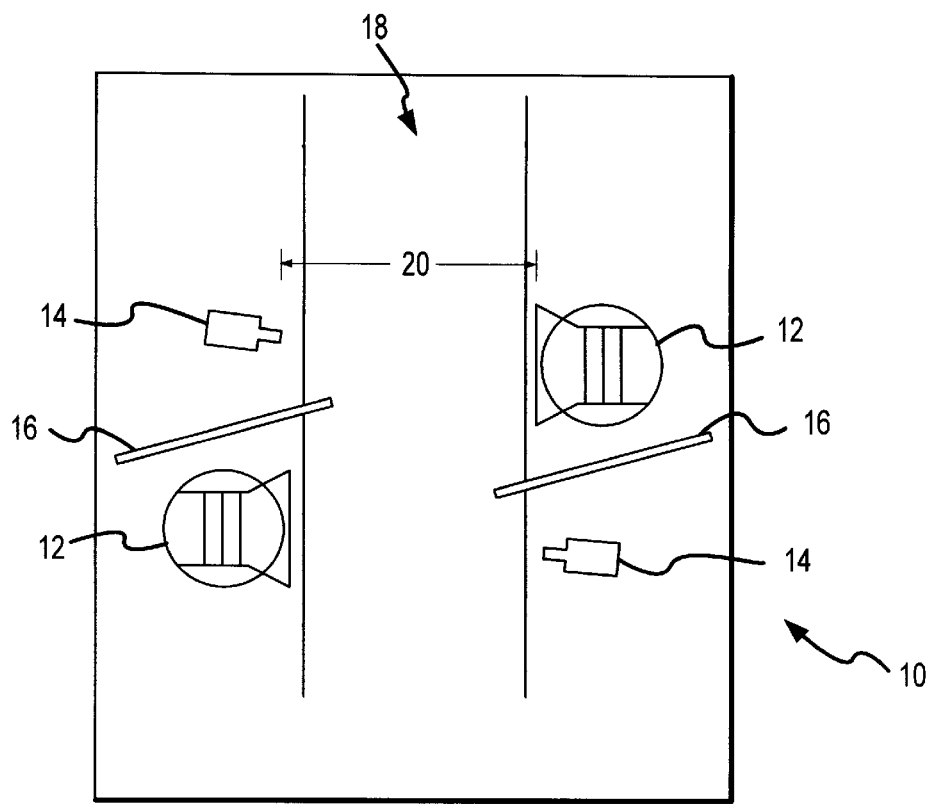
FIG. 1 is a top diagrammatic view of a wafer processing tool equipped with a vision system according to the present invention.

Referring now to FIG. 1, a wafer cleaning machine is illustrated containing a water track 18, two cassette loaders 12, and two vision systems 14. Vision systems 14 are situated a sufficient distance 20 from cassette loaders 12 such that light emitted from fiber optic wave guides 16 and reflected off the edges of wafers in cassettes situated on loaders 12 is received by vision system 14.

Figure 2:
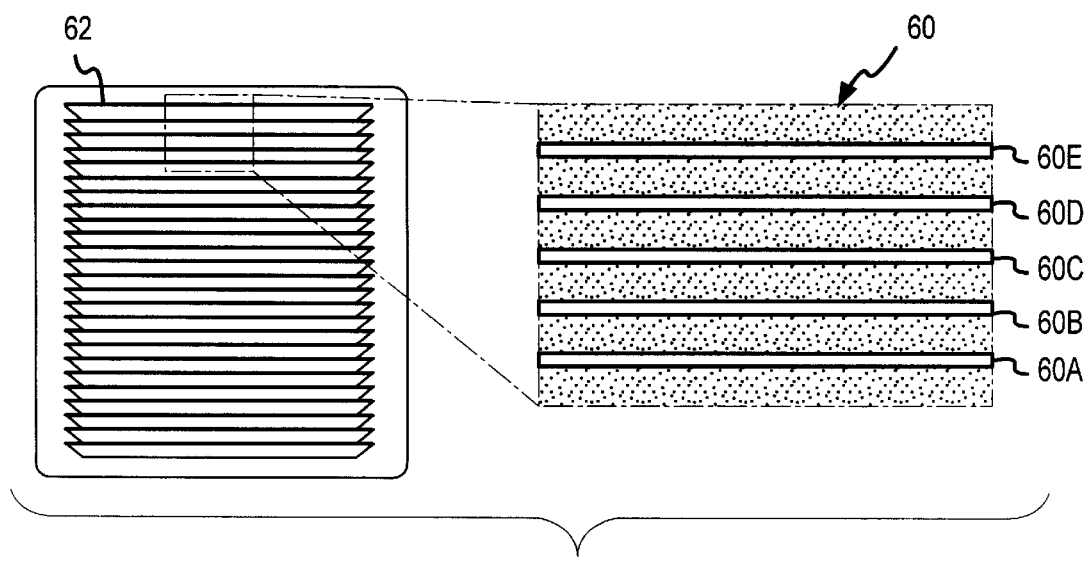
FIG. 2 is a front view of a cassette and an exploded representation of the field of view obtained by the vision system of FIG. 1.

The vision system is suitably arranged to detect cross-slotted and double-slotted wafers. Preferably, vision system 14 is situated to obtain a field of view measuring 1⅞" by 1⅜" that encompasses five wafer positions. FIG. 2 illustrates such a field of view 60 obtained from a cassette 62 that encompasses five wafer positions 60A–60E. The field of view may be adjusted as necessary to adjust for spacial limitations within a tool or to view a different number of wafer positions. Commonly known optics principals dictate the focal length, aperture settings, the distance of the vision system from the subject, and the ambient lighting conditions necessary to achieve a desired field of view. To reduce the need to insulate vision system 14 from liquid and electrical hazards, it is preferably situated outside of the wet environment. In the preferred embodiment, the front of the lens employed by vision system is situated 10.5" from the front of a cassette contained within loader 12. A CM4000 standard size camera and a standard 35 mm lens such as an HF 35A-2 manufactured by PVT located in Norcross, Ga. are preferably utilized.

Figure 3:
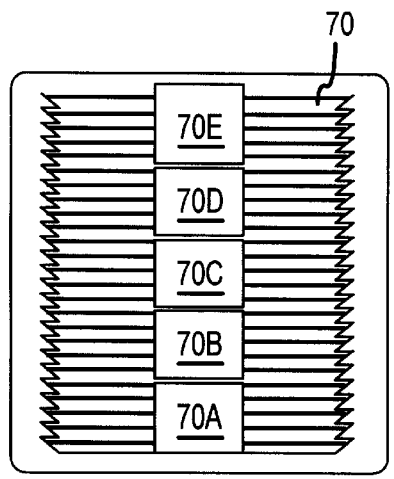
FIG. 3 is a front view of a cassette depicting the five "snap shots" taken by the vision system of FIG. 1 takes to obtain a complete image of a cassette.

As illustrated in FIG. 3, vision system 14 captures the wafer positions of an entire cassette by taking multiple images or snap-shots 70A–70E as cassette 70 is lowered into a cleaning and/or wetting solution. Each image presents the same field of view as cassette 70 is lowered such that each of images 70A–70E appears to vision system 14 as shown in FIG. 2. By using the same field of view for each image, vision system 14 may utilize only one inspection program for any particular wafer size. Each image 70A–70E preferably captures five wafer positions. This number may be modified, for example, by positioning vision system 14 further from loader 12 (to obtain more than five wafer positions), or closer to loader 12 (to obtain less than five wafer positions).

Regardless of the number of wafers captured in any image, however, it is paramount that vision system 14 is positioned to receive only edge reflections from the wafers. If the camera is skewed at an angle relative to the plane of the wafers cassette so as to receive reflections from the wafer top or bottom surfaces, rather than the from the wafer edges, the reflected images may be misinterpreted as cross-slotted wafers, double-slotted wafers, or the like. It should also be noted that appropriately positioned multiple vision and lighting systems could be utilized to simultaneously capture multiple images of the entire cassette, thereby reducing the need to lower the cassette into the cleaning solution at a rate which allows for the taking of multiple images by one vision system.

As shown in FIGS. 1 and 2, the vision system utilizes directional front lighting to illuminate the wafers contained within a cassette. Preferably, fiber optic cables 16 are positioned such that the light beam emanating from cables 16 illuminates at least five wafers at a time. This is depicted in FIG. 2, wherein white streaks 60A–60E represent the light reflected off the wafer edges and the dark background represents the cassette housing. While fiber optic cables are preferred, any illumination system which emits a suitable light beam upon the wafers such that their edges may be detected by vision system 14 may be utilized. Moreover, while a white light source is preferably utilized to reduce absorption concerns prevalent in the prior art, other light sources which generate suitable spectrums of light could also be used.

Figure 4:
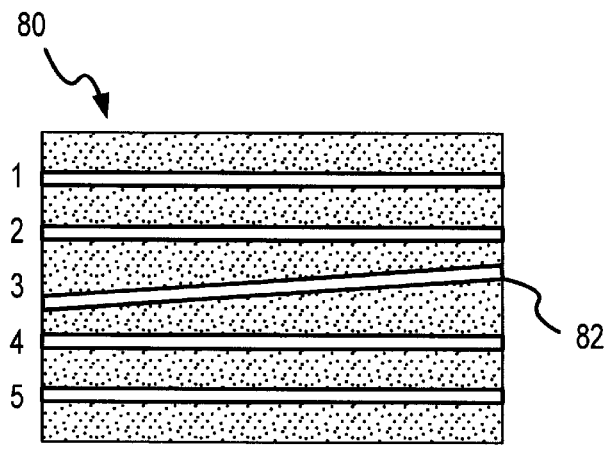
FIG. 4 is a depiction of a field of view obtained by the vision system of FIG. 1 containing a cross-slotted wafer.
Figure 5:
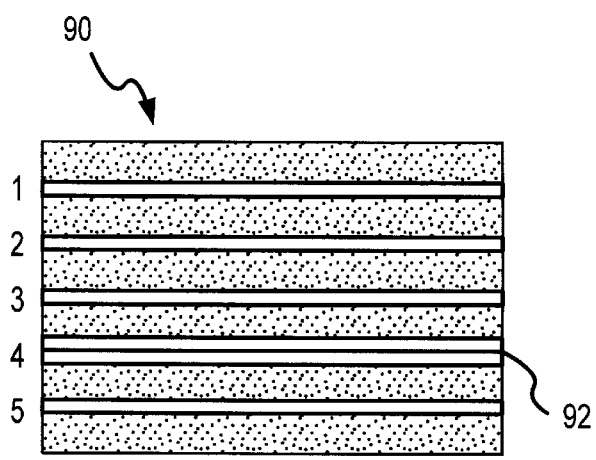
FIG. 5 is a depiction of a field of view obtained by the vision system of FIG. 1 containing a double-slotted wafer.

FIG. 2 illustrates a field of view in which all wafers are correctly positioned. FIGS. 4 and 5, by contrast, show fields of view containing mispositioned wafers. In FIG. 4, the illustrated field of view 80 contains a wafer 82 in a cross-slotted condition. The edge of cross-slotted wafer 82 reflects sufficient light such that a diagonal line appears against the dark background. In FIG. 5, field of view 90 contains a double-slotted wafer at location 92. Since the entire cassette must be removed to correct a cross-slotted or double-slotted condition, it is not necessary to precisely determine within which particular slot these conditions exist. Instead, the present invention merely needs to detect the cross-slotted or double-slotted wafer and notify the tool operator of the anomalous condition.

Figure 6:
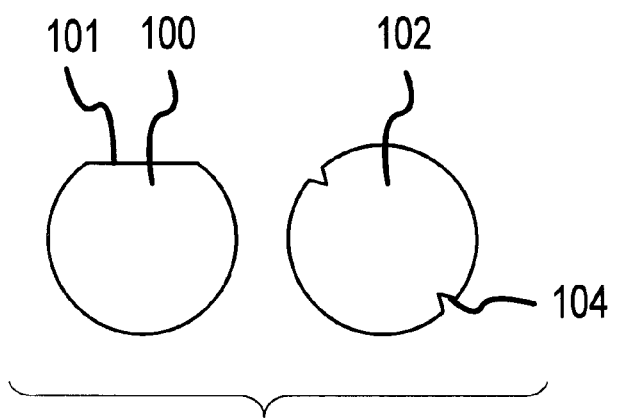
FIG. 6 is a top diagrammatic view showing a wafer with a flattened edge and a wafer with a notched edge.
Figure 7:
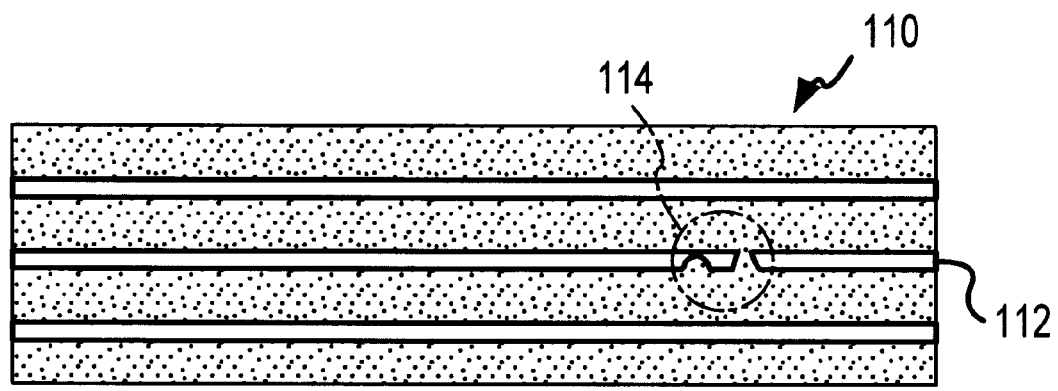
FIG. 7 is a depiction of a field of view obtained by the vision system of FIG. 1 containing a notched-edge wafer

FIG. 6 illustrates wafer edge deficiencies of concern to the front lighting system of the present invention. Wafers are often not perfectly round. Wafer 100, for example, has a flattened edge 101; and wafer 102 has a notches 104 in its edge. Such discrepancies are irrelevant in back lit vision systems since the wafer casts a shadow which the system should detect. In the inventive front lit system, however, such discrepancies may result in anomalies in the field of view image. FIG. 7, for example, shows a field of view image 110 containing a discontinuous reflection 112 having a gap 114 which might result from a notched-edge wafer such as wafer 102 in FIG. 6. Should vision system 14 sample reflected image 112 at the location of gap 114, the system may not detect the wafer's presence. In order to eliminate false readings due to such gaps, the vision system software is preferably configured such that multiple samples are taken far enough apart so that notched portions of wafer edges will interrupt only one sampling, while the remaining samplings will detect the presence of the wafer. Flattened surfaces such as surface 101 of wafer 100 are of lesser concern. While flat surfaces reflect incident light in a different manner than a rounded surface, testing has revealed that sufficient light is still reflected off a flattened surface to permit detection of the wafer.

Fields of view captured by vision system 14 are converted by a suitable processor into an array of pixels. An ACUITY IVS vision system or a PVT SMART IMAGE SYSTEM is preferably utilized to convert the captured image into a 640 pixel by 480 pixel array. Other types of processors or sizes of pixel arrays, however, could be utilized.

Figure 8:
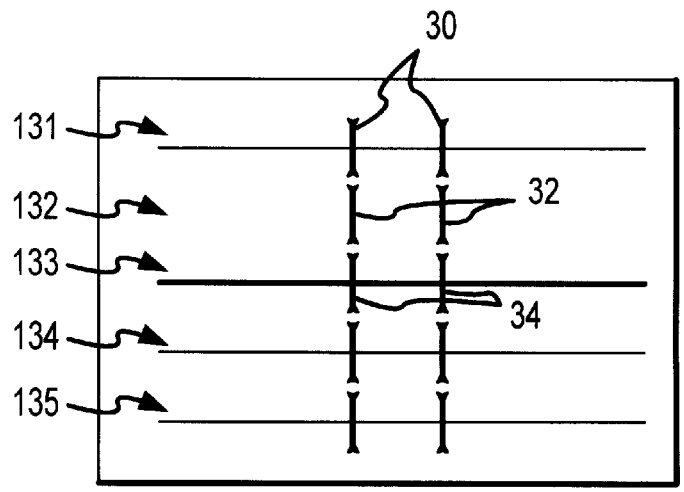
FIG. 8 is a schematic view illustrating scans performed by the processor of the present invention to detect double-slotted and missing wafers.

Each pixel is assigned a value based upon a predefined gray scale range, with higher values indicating detection of higher intensities of light. The processor then compares differences in values between adjoining pixels to determine wafer edge locations. Edge locations are signaled by drastic changes in gray scale level over a few pixels. The pixel analysis preferably begins on the edge of the cassette and works towards the center in search for drastic pixel value transitions. As shown in FIG. 8, two scans are preferably swept across each wafer position within the captured image;

i.e., two scans 30 are performed for wafer position 131, two scans 32 are performed for position 132, two scans 34 are performed for position 133, and so on. Dual scanning in this manner addresses the problems created by edge notches described above by providing a redundant scan to discriminate between notches and truly absent wafers.

Figure 9:
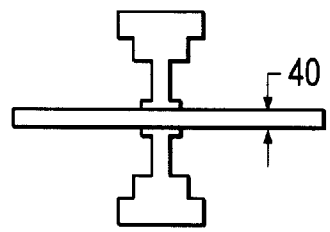
FIG. 9 is a schematic view illustrating a scan performed by the processor of the present invention to determine the thickness of a scanned image.

As shown in FIG. 9, the processor searches for edge transitions and determines the distance 40 between the transitions. If the distance 40 is zero, as would occur in FIG. 8 for scan 32, then a wafer is not present. If the distance 40 falls within a predetermined range, as would occur in FIG. 8 for scan 30, then a single wafer is present in the corresponding cassette slot. Finally, if distance 40 falls outside of the predetermined range, as would occur in FIG. 8 for scan 34, then two wafers may be present. The current invention, for example, signals a double-slotted condition whenever the distance 40 is greater than 10 pixels.

Figure 10:
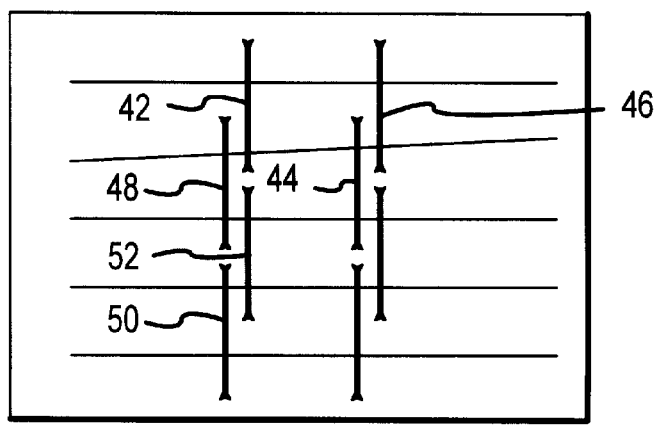
FIG. 10 is a schematic view illustrating scans performed by the processor of the present invention to detect cross-slotted wafers.

A similar methodology is used to detect cross-slotted wafers. Scans are swept across the captured image as shown in FIG. 10 and are utilized to determine the distance between wafers. A cross-slotted condition is signaled when the distance between wafers is either too large, as shown by scans 42 and 44, or too small, as shown by scans 46 and 48. A nominal distance between scans is shown by scans 50 and 52. Two scans, as described above, are utilized for each expected wafer position to reduce the possibility of non-detection due to notched edges.

The amount of light emitted upon the wafer edges may optionally be supplemented or augmented by a strobe light. The strobe light can augment, or even replace, the light emitted by the fiber optic cable. The strobe light is positioned such that the light generated is incident upon the wafer surfaces, and, the strobing of the light and the capture of wafer images by vision system 14 are synchronized. Use of the strobe light ensures that sufficient light is reflected from the wafer edges to distinguish the edges from background or ambient light, and also permits use of vision system 14 under a wide variety of lighting conditions, possibly even under bright daylight conditions. Utilization of a strobe light may also prevent anomalous readings from occurring in tools where vibrations diminish a vision system's ability to accurately detect wafers within a cassette. A strobe also reduces the amount of heat generated within the chamber, since it is on only momentarily and emits significantly reduced amounts of radiation. As with the fiber optics cable source, the light source may be positioned out of the wet environment behind a transparent barrier or the like.

Although the foregoing description sets forth a preferred exemplary embodiment of the invention, the scope of the invention is not limited to this specific embodiment. Modification may be made to the specific form and design of the invention without departing from its spirit and scope as expressed in the following claims.

What is claimed is:

1. An apparatus for mapping a plurality of workpieces located within a workpiece processing tool, wherein each of said workpieces has an edge, a top surface, and a bottom surface; said apparatus comprising:
    an illumination device which generates a white light and is configured such that said light is directed towards and is reflected off the edges of said workpieces; and
    a vision system configured to receive said light reflected off the edges of said workpieces.

2. The apparatus of claim 1 wherein said illumination device further comprises a fiber optic cable having a first end and a second end, wherein said first end is connected to a light generating source which emits light, and said second end is configured such that said light emitted by said light generating source is routed through said fiber optic cable and directed towards said edge of said workpieces.

3. The apparatus of claim 2 wherein said light generating source is located outside said workpiece processing tool.

4. The apparatus of claim 1 wherein said illumination device further comprises a strobe light in communication and synchronization with said vision system such that said strobe light turns on and emits light when said vision system is ready to receive light reflected off the edges of said workpieces, and at all other times said strobe light remains off.

5. The apparatus of claim 1 wherein said vision system further comprises:
    a camera having a field of view within which said camera receives said light reflected off the edges of said workpieces thereby forming an image, and outputs said image;
    a converter which receives said image, converts said image into a format suitable for further processing, and outputs a converted image; and
    a processor which receives said converted image, analyzes said converted image, and generates a digital map depicting a location and orientation of said workpieces within said workpiece processing tool.

6. The apparatus of claim 5 wherein said converted image is in a digital format.

7. The apparatus of claim 5 wherein said camera utilizes a 35 mm lens.

8. The apparatus of claim 5 wherein said camera is positioned within said workpiece processing tool such that said field of view of said camera captures five (5) workpieces contained within a cassette situated within said workpiece processing tool.

9. The apparatus of claim 5 wherein said field of view is 1.875 inches by 1.375 inches.

10. The apparatus of claim 5 wherein said camera is positioned within said workpiece processing tool such that said camera is 10.5" from said edge of said workpieces.

11. The apparatus of claim 5 wherein said camera is positioned so as to receive reflections of said light off the edges of said workpieces while not receiving reflections of said light off said top surfaces or said bottom surfaces of said workpieces.

12. The apparatus of claim 5 wherein said converter generates said converted image by overlaying a grid of pixels upon said image and assigning a predefined gray scale number to each of said pixels overlaying said image.

13. The apparatus of claim 12 wherein said processor generates said digital map by comparing said gray scale number between adjoining pixels to determine said location and orientation of the edges of each of said workpieces.

14. The apparatus of claim 5 wherein said processor detects cross-slotted workpieces.

15. The apparatus of claim 5 wherein said processor detects double-slotted workpieces.

16. An apparatus for mapping a plurality of workpieces located within a workpiece processing tool, wherein each of said workpieces has an edge, a top surface, and a bottom surface; said apparatus comprising:
    an illumination device which generates light and is configured such that said light is directed towards and is reflected off the edges of said workpieces wherein said illumination device further comprises a fiber optic cable having a first end and a second end, wherein said first end is connected to a light generating source which emits light, and said second end is configured such that said light emitted by said light generating source is routed through said fiber optic cable and directed towards said edge of said workpieces; and a vision system configured to receive said light reflected off the edges of said workpieces.

* * * * *